US012661694B2

(12) United States Patent
Kosai et al.

(10) Patent No.: US 12,661,694 B2
(45) Date of Patent: Jun. 23, 2026

(54) LIQUID PROCESSING APPARATUS AND LIQUID PROCESSING METHOD

(71) Applicant: Tokyo Electron Limited, Tokyo (JP)

(72) Inventors: Kazuki Kosai, Koshi (JP); Taisei Inoue, Koshi (JP); Yusuke Takamatsu, Koshi (JP); Takahisa Otsuka, Koshi (JP); Masaru Amai, Tokyo (JP); Itaru Kanno, Tokyo (JP); Hiroshi Yano, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 737 days.

(21) Appl. No.: 18/004,132

(22) PCT Filed: Jun. 22, 2021

(86) PCT No.: PCT/JP2021/023521
§ 371 (c)(1),
(2) Date: Jan. 3, 2023

(87) PCT Pub. No.: WO2022/009661
PCT Pub. Date: Jan. 13, 2022

(65) Prior Publication Data
US 2023/0264233 A1      Aug. 24, 2023

(30) Foreign Application Priority Data
Jul. 6, 2020    (JP) ................................. 2020-116419

(51) Int. Cl.
B08B 3/14 (2006.01)
B01D 29/56 (2006.01)
(Continued)

(52) U.S. Cl.
CPC ................ B08B 3/14 (2013.01); B01D 29/56 (2013.01); B01D 29/60 (2013.01); B01D 35/143 (2013.01); H10P 72/0402 (2026.01); B08B 3/022 (2013.01)

(58) Field of Classification Search
None
See application file for complete search history.

(56) References Cited

U.S. PATENT DOCUMENTS

2016/0293447 A1* 10/2016 Iwasaki .............. H01L 21/6708
2021/0001370 A1* 1/2021 Nobukuni ................ B05C 3/02

FOREIGN PATENT DOCUMENTS

CN        103796795 A      5/2014
JP        2011-035135 A      2/2011
(Continued)

OTHER PUBLICATIONS

JP2020047828 (Year: 2020).*

*Primary Examiner* — Bradley R Spies
*Assistant Examiner* — Jeannie McDermott
(74) *Attorney, Agent, or Firm* — Armstrong Teasdale LLP

(57) ABSTRACT

A liquid processing apparatus includes: a storage tank that stores a processing liquid; a first circulation line that causes the processing liquid sent from the storage tank to pass through a first filter and to return to the storage tank; and at least one second circulation line that causes the processing liquid to pass through a second filter and to return to the storage tank, wherein the second circulation line is shorter in a flow path than the first circulation line, a second flow rate of the processing liquid flowing into the second circulation line is smaller than a first flow rate of the processing liquid flowing into the first circulation line at a downstream side of a location where the first circulation line and the second
(Continued)

circulation line are joined, and the second filter is smaller in a filtration amount per unit time than the first filter.

9 Claims, 8 Drawing Sheets

(51) Int. Cl.

| | |
|---|---|
| *B01D 29/60* | (2006.01) |
| *B01D 35/143* | (2006.01) |
| *B08B 3/02* | (2006.01) |
| *H10P 72/00* | (2026.01) |

(56)                References Cited

FOREIGN PATENT DOCUMENTS

| | | | | | |
|---|---|---|---|---|---|
| JP | 2016-072296 | A | | 5/2016 | |
| JP | 2020047828 | A | * | 3/2020 | ....... H01L 21/67098 |

* cited by examiner

Figure 4:
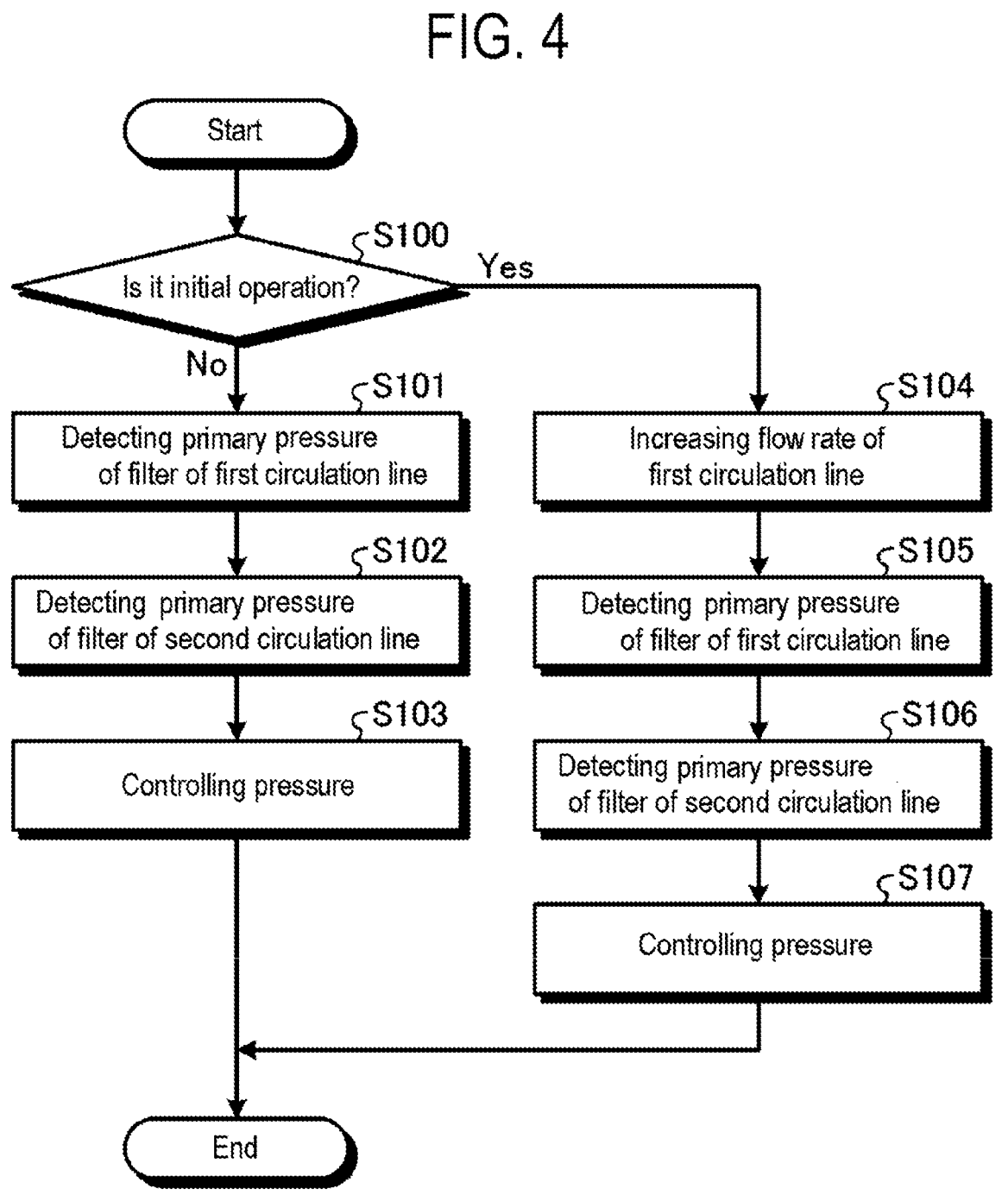

Start

S100

Is it initial operation?

Yes

No

S101

Detecting primary pressure
of filter of first circulation line

S104

Increasing flow rate of
first circulation line

S102

Detecting primary pressure
of filter of second circulation line

S105

Detecting primary pressure
of filter of first circulation line

S103

Controlling pressure

S106

Detecting primary pressure
of filter of second circulation line

S107

Controlling pressure

End

LIQUID PROCESSING APPARATUS AND LIQUID PROCESSING METHOD

CROSS-REFERENCE TO RELATED APPLICATIONS

The present application is a U.S. National Stage Entry of International Patent Application No. PCT/JP2021/023521, filed Jun. 22, 2021, which claims the benefit of priority to Japanese Patent Application No. 2020-116419, filed Jul. 6, 2020, each of which is hereby incorporated herein by reference in its entirety.

TECHNICAL FIELD

The present disclosure relates to a liquid processing apparatus and a liquid processing method.

BACKGROUND

Patent Document 1 discloses a liquid processing apparatus capable of supplying a processing liquid to a processing unit through a circulation line. In the liquid processing apparatus, the processing liquid, which is not supplied to the processing unit, is returned to a storage device through the circulation line.

PRIOR ART DOCUMENT

Patent Document

Patent Document 1: Japanese Laid-Open Patent Publication No. 2011-35135

SUMMARY

The present disclosure provides a technique for improving cleanliness of a processing liquid.

A liquid processing apparatus according to an aspect of the present disclosure includes: a storage tank that stores a processing liquid; a first circulation line configured to cause the processing liquid sent from the storage tank to pass through a first filter and to return to the storage tank; and at least one second circulation line connected to the first circulation line and configured to cause the processing liquid to pass through a second filter and to return to the storage tank, wherein the at least one second circulation line is shorter in a flow path than the first circulation line, a second flow rate of the processing liquid flowing into the at least one second circulation line is smaller than a first flow rate of the processing liquid flowing into the first circulation line at a downstream side of a junction location where the first circulation line and the at least one second circulation line are joined, and the second filter is smaller in a filtration amount per unit time than the first filter.

According to the present disclosure, it is possible to improve cleanliness of a processing liquid.

BRIEF DESCRIPTION OF DRAWINGS

FIG. 1 is a view illustrating a schematic configuration of a substrate processing system according to an embodiment.

FIG. 3 is a view illustrating a schematic configuration of a processing liquid source according to an embodiment.

FIG. 4 is a flowchart for explaining a flow rate control process in a second circulation line according to an embodiment.

FIG. 6 is a view illustrating a schematic configuration of a processing liquid source of a substrate processing system according to a modification of the embodiment.

FIG. 7 is a view illustrating a schematic configuration of a processing liquid source of a substrate processing system according to a modification of the embodiment.

FIG. 8 is a view illustrating a schematic configuration of a portion of the substrate processing system according to the modification of the embodiment.

DETAILED DESCRIPTION

Figure 2:
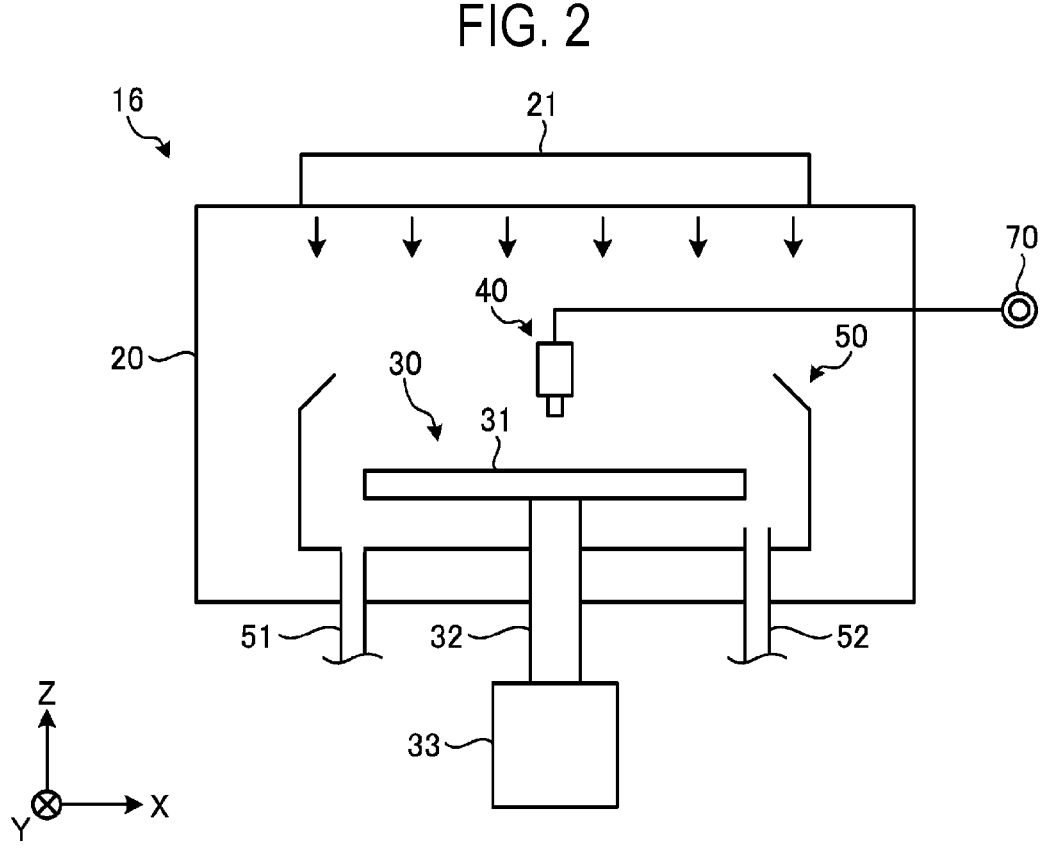
FIG. 2 is a schematic view illustrating a configuration of a processing unit according to an embodiment.

Hereinafter, embodiments of a liquid processing apparatus and a liquid processing method disclosed herein will be described in detail with reference to the accompanying drawings. The disclosed liquid processing apparatus and liquid processing method are not limited by the embodiments to be described below.

<Outline of Substrate Processing System>

Figure 1:
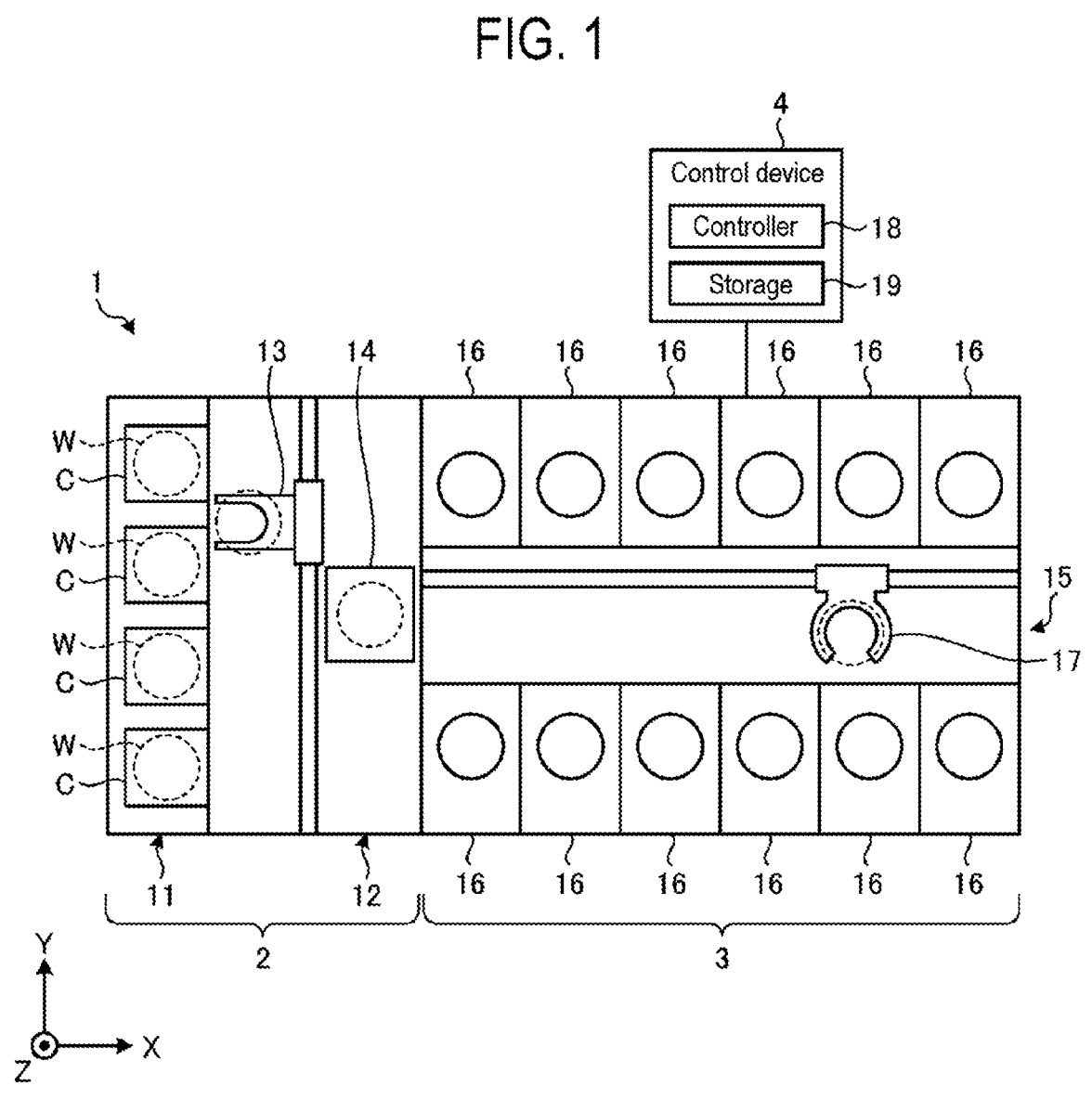

A schematic configuration of a substrate processing system 1 (an example of a liquid processing apparatus) according to an embodiment will be described with reference to FIG. 1. FIG. 1 is a view illustrating the schematic configuration of the substrate processing system 1 according to an embodiment. In the following description, for the clarification of a positional relationship, an X-axis, a Y-axis and a Z-axis, which are orthogonal to one another, are defined, and a positive Z-axis direction is defined as a vertical upward direction.

As illustrated in FIG. 1, the substrate processing system 1 includes a carry-in/out station 2 and a processing station 3. The carry-in/out station 2 and the processing station 3 are provided adjacent to each other.

The carry-in/out station 2 includes a carrier stage 11 and a transferrer 12. A plurality of carriers C, each of which accommodates a plurality of substrates (semiconductor wafers W in this embodiment) (hereinafter, referred to as "wafers W") in a horizontal state, are placed on the carrier stage 11.

The transferrer 12 is provided adjacent to the carrier stage 11 and includes a substrate transfer device 13 and a deliverer 14 provided therein. The substrate transfer device 13 includes a wafer holding mechanism configured to hold the wafer W. In addition, the substrate transfer device 13 is movable in a horizontal direction and a vertical direction and rotatable about a vertical axis thereof, and thus transfers the wafer W between the carrier C and the deliverer 14 using the wafer holding mechanism.

The processing station 3 is provided adjacent to the transferrer 12. The processing station 3 includes a transferrer 15 and a plurality of processing units 16. The plurality of processing units 16 are arranged side by side on opposite sides of the transferrer 15.

The transferrer 15 includes a substrate transfer device 17 provided therein. The substrate transfer device 17 includes a wafer holding mechanism configured to hold the wafer W. In addition, the substrate transfer device 17 is movable in the horizontal direction and the vertical direction and rotatable about a vertical axis thereof, and thus transfers the wafer W between the deliverer 14 and each processing unit 16 using the wafer holding mechanism.

The processing unit 16 performs substrate processing on the wafer W transferred thereto by the substrate transfer device 17. The processing unit 16 holds the transferred wafer and performs the substrate processing on the held wafer. The processing unit 16 supplies a processing liquid to the held wafer to perform the substrate processing. The processing liquid is a CF-based cleaning liquid for processing the wafer W, such as hydrofluoro carbon (HFC), or a cleaning liquid for cleaning residues of the wafer W, such as diluted hydrofluoric acid (DHF). The processing liquid is a rinse liquid such as deionized water (DIW), or a substitution liquid such as isopropyl alcohol (IPA).

The substrate processing system 1 includes a control device 4. The control device 4 is, for example, a computer, and includes a controller 18 and a storage 19. The storage 19 stores programs for controlling various processes executed in the substrate processing system 1. The controller 18 controls an operation of the substrate processing system 1 by reading and executing the programs stored in the storage 19.

In addition, such programs may be stored in a non-transitory computer-readable storage medium, and may be installed on the storage 19 of the control device 4 from the storage medium. The computer-readable storage medium is, for example, a hard disk (HD), a flexible disk (FD), a compact disk (CD), a magneto-optical disk (MO), a memory card, or the like.

In the substrate processing system 1 configured as above, first, the substrate transfer device 13 of the carry-in/out station 2 takes out the wafer W from the carrier C placed on the carrier stage 11 and places the taken-out wafer W on the deliverer 14. The wafer W placed on the deliverer 14 is taken out from the deliverer 14 by the substrate transfer device 17 in the processing station 3 and is carried into the processing unit 16.

The wafer W carried into the processing unit 16 is subjected to the substrate processing in the processing unit 16, and subsequently is carried out from the processing unit 16 and placed on the deliverer 14 by the substrate transfer device 17. Then, the processed wafer W placed on the deliverer 14 is returned to the carrier C in the carrier stage 11 by the substrate transfer device 13.

<Outline of Processing Unit>

Next, an outline of the processing unit 16 will be described with reference to FIG. 2. FIG. 2 is a schematic view illustrating a configuration of the processing unit 16 according to the embodiment. The processing unit 16 includes a chamber 20, a substrate holding mechanism 30, a processing liquid supplier 40, and a recovery cup 50.

The chamber 20 accommodates the substrate holding mechanism 30, the processing liquid supplier 40, and the recovery cup 50. A ceiling portion of the chamber 20 is provided with a fan filter unit (FFU) 21. The FFU 21 forms a down-flow within the chamber 20.

The substrate holding mechanism 30 includes a holder 31, a support column 32, and a driver 33. The holder 31 holds the wafer W horizontally. The support column 32 is a member extending in the vertical direction. A base end portion of the support column 32 is rotatably supported by the driver 33, and a tip end portion thereof horizontally supports the holder 31. The driver 33 rotates the support column 32 around a vertical axis thereof.

The substrate holding mechanism 30 rotates the holder 31 supported by the support column 32 by rotating the support column 32 with the driver 33. This causes the wafer W held by the holder 31 to rotate.

The processing liquid supplier 40 supplies the wafer W with the processing liquid. The processing liquid supplier 40 is connected to a processing liquid source 70. The processing liquid supplier 40 includes a plurality of nozzles. For example, the plurality of nozzles are provided to correspond to respective processing liquids. Each nozzle ejects the processing liquid supplied from each processing liquid source 70 onto the wafer W.

The recovery cup 50 is disposed to surround the holder 31 and collects the processing liquid scattered from the wafer W with the rotation of the holder 31. A drainage port 51 is formed in a bottom portion of the recovery cup 50, and the processing liquid collected by the recovery cup 50 is ejected from the drainage port 51 to the outside of the processing unit 16. In addition, in the bottom portion of the recovery cup 50, an exhaust port 52 is formed to discharge the gas supplied from the FFU 21 to the outside of the processing unit 16.

<Outline of Processing Liquid Source>

Figure 3:
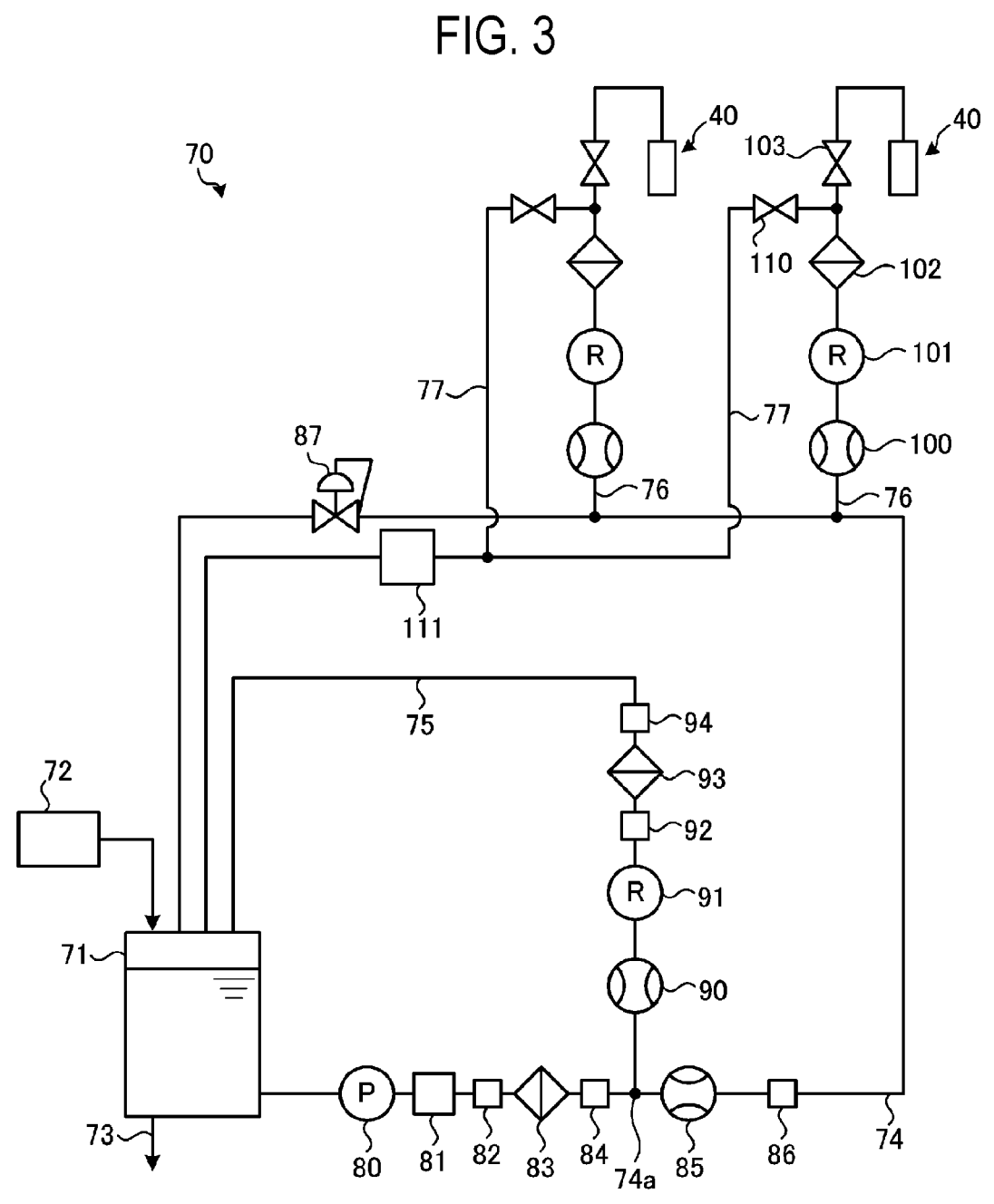

Next, the processing liquid source 70 will be described with reference to FIG. 3. FIG. 3 is a view illustrating a schematic configuration of the processing liquid source 70 according to the embodiment. Here, the processing liquid source 70, which supplies IPA, will be described as an example. The configuration of the processing liquid source 70 illustrated in FIG. 3 is not limited to IPA, and may be applied to a configuration of a processing liquid source, which supplies another processing liquid. FIG. 3 illustrates an example in which the processing liquid source 70 supplies IPA to two processing liquid suppliers 40, but the present disclosure is not limited thereto. The processing liquid source 70 supplies IPA to a plurality of processing liquid suppliers 40. Alternatively, the processing liquid source 70 may supply IPA to a single processing liquid supplier 40.

The processing liquid source 70 includes a tank 71, a processing liquid replenisher 72, a drainage line 73, a first circulation line 74, a second circulation line 75, a supply line 76, and a return line 77.

A tank 71 (an example of the storage tank) stores IPA (an example of the processing liquid). The processing liquid replenisher 72 supplies new IPA to the tank 71. For example, the processing liquid replenisher 72 supplies the new IPA to the tank 71 when the IPA in the tank 71 is replaced or when the IPA in the tank 71 becomes smaller than a given amount.

When the IPA in the tank 71 is replaced, the drainage line 73 discharges the IPA from the tank 71 to the outside and discards the IPA. When replacing the IPA in the tank 71, the IPA is circulated while new IPA is being supplied, and the IPA remaining in the first circulation line 74, the second circulation line 75, the supply line 76, and the return line 77 may be discarded. That is, IPA including the IPA remaining in the first circulation line 74 and the like may be replaced.

The first circulation line 74 causes the IPA sent from the tank 71 to return to the tank 71. The first circulation line 74 is provided so that the IPA flows outside the tank 71 and returns to the tank 71 again. The first circulation line 74 is provided so that the IPA can be supplied to the plurality of processing units 16.

The first circulation line 74 is provided with a pump 80, a heater 81, a first pressure sensor 82, a filter 83, a second pressure sensor 84, a flowmeter 85, a temperature sensor 86, and a backing pressure valve 87. Specifically, the first circulation line 74 is provided with the pump 80, the heater 81, the first pressure sensor 82, the filter 83, the second pressure sensor 84, the flowmeter 85, the temperature sensor 86, and the backing pressure valve 87 sequentially from the upstream side in an IPA flow direction with reference to the tank 71.

The pump 80 forcibly feeds the IPA in the first circulation line 74. The forcibly-fed IPA circulates through the first circulation line 74 and is returned to the tank 71.

The heater 81 is provided in the first circulation line 74 to adjust a temperature of the IPA. Specifically, the heater 81 heats the IPA. The heater 81 controls an amount of heated IPA based on a signal from the control device 4 (see FIG. 1) to adjust the temperature of the IPA. For example, the amount of IPA heated by the heater 81 is adjusted based on the temperature of the IPA detected by the temperature sensor 86.

For example, the control device 4 controls the heater 81 to adjust the temperature of the IPA to a given temperature. The given temperature is a temperature at which the temperature of the IPA ejected from the nozzle of the processing liquid supplier 40 onto the wafer W at the time of supplying the IPA becomes a preset processing temperature. The given temperature is a temperature set based on a heat capacity of the filter 102 provided in the supply line 76 or the like.

The first pressure sensor 82 detects a primary pressure of the filter 83. That is, the first pressure sensor 82 detects the pressure of the IPA flowing into the filter 83.

The filter 83 removes foreign substances such as particles contained in the IPA flowing through the first circulation line 74.

The second pressure sensor 84 detects a secondary pressure of the filter 83. That is, the second pressure sensor 84 detects the pressure of the IPA flowing out from the filter 83.

The flowmeter 85 measures a flow rate of the IPA flowing through the first circulation line 74. The temperature sensor 86 detects a temperature of the IPA flowing through the first circulation line 74. The temperature sensor 86 is provided in the first circulation line 74 on the upstream side of a location where the supply line 76 is connected.

The backing pressure valve 87 increases a valve opening degree when the pressure of the IPA on the upstream side of the backing pressure valve 87 is higher than a given pressure. The backing pressure valve 87 reduces the valve opening degree when the pressure of the IPA on the upstream side of the backing pressure valve 87 is lower than the given pressure. The backing pressure valve 87 has a function of keeping the pressure of the processing liquid on the upstream side at the given pressure. The given pressure is a preset pressure. The valve opening degree of the backing pressure valve 87 is controlled by the control device 4.

The backing pressure valve 87 is capable of adjusting the flow rate of the IPA in the first circulation line 74 by controlling the valve opening degree. That is, the backing pressure valve 87 is provided in the first circulation line 74 and adjusts the flow rate of the IPA returning to the tank 71 through the first circulation line 74. The flow rate of the IPA in the first circulation line 74 may be adjusted by controlling an ejection pressure of the pump 80. The flow rate of the IPA in the first circulation line 74 is controlled based on the flow rate of the IPA detected by the flowmeter 85.

The first circulation line 74 causes the IPA (an example of the processing liquid) sent from the tank 71 (an example of the storage tank) to pass through the filter 83 (an example of the first filter) and to return to the tank 71.

The second circulation line 75 is connected to the first circulation line 74. The second circulation line 75 is connected to the first circulation line 74 at a junction location 74a provided between the second pressure sensor 84 and the flowmeter 85. The second circulation line 75 is provided so that the IPA flows outside the tank 71 and returns to the tank 71 again. The second circulation line 75 is branched at the first circulation line 74 and is provided to cause the IPA to return to the tank 71. The second circulation line 75 has a flow path length shorter than that of the first circulation line 74. The flow rate of the IPA (an example of the processing liquid) flowing into the second circulation line 75 is smaller than the flow rate of the IPA flowing into the first circulation line 74 at the downstream side of the junction location 74a the first circulation line 74 and the second circulation line 75 are joined.

The second circulation line 75 is provided with a flowmeter 90, a constant pressure valve 91, a first pressure sensor 92, a filter 93, and a second pressure sensor 94. Specifically, the second circulation line 75 is provided with the flowmeter 90, the constant pressure valve 91, the first pressure sensor 92, the filter 93, and the second pressure sensor 94 in the order of the flowmeter 90, the constant pressure valve 91, the first pressure sensor 92, the filter 93, and the second pressure sensor 94 from the side of the first circulation line 74. That is, the second circulation line 75 is provided with the flowmeter 90, the constant pressure valve 91, the first pressure sensor 92, the filter 93, and the second pressure sensor 94 in the order of the flowmeter 90, the constant pressure valve 91, the first pressure sensor 92, the filter 93, and the second pressure sensor 94 from the upstream side in the flow direction of the IPA.

The flowmeter 90 measures the flow rate of the IPA flowing through the second circulation line 75. The constant pressure valve 91 adjusts the pressure of the IPA at the downstream side of the constant pressure valve 91. The constant pressure valve 91 (an adjuster) is provided in the second circulation line 75 and adjusts the flow rate of the IPA flowing into the filter 93 (an example of a second filter). For example, the constant pressure valve 91 sets the flow rate of the IPA flowing into the filter 93 to a given flow rate and adjusts the pressure of the IPA. The constant pressure valve 91 adjusts the pressure of the IPA based on a signal from the control device 4. That is, the constant pressure valve 91 (an example of the adjuster) is controlled by the control device 4.

The first pressure sensor 92 detects a primary pressure of the filter 93. That is, the first pressure sensor 92 detects the pressure of the IPA flowing into the filter 93.

The filter 93 removes foreign substances in the IPA flowing through the second circulation line 75. The filter 93 is a smaller filter than the filter 83 provided in first circulation line 74. An amount of filtration per unit time in the filter 93 (an example of the second filter) is less than an amount of filtration per unit time in the filter 83 (an example of the first filter). The filter 93 is, for example, a point-of-use (POU) filter. By using a small filter such as a POU filter, an increase in size of the second circulation line 75, that is, an increase in size of the substrate processing system 1 is suppressed.

The second pressure sensor 94 detects a secondary pressure of the filter 93. That is, the second pressure sensor 94 detects the pressure of the IPA flowing out from the filter 93.

The second circulation line 75 is connected to the first circulation line 74, and causes the IPA (an example of the processing liquid) to pass through the filter 93 (an example of the second filter) and to return to the tank 71 (an example of the storage tank).

The supply line 76 is connected to the first circulation line 74. The supply line 76 is connected to the first circulation line 74 at the downstream side of the temperature sensor 86 and at the upstream side of the backing pressure valve 87. A plurality of supply lines 76 are provided to correspond to the plurality of processing liquid suppliers 40, respectively. The supply line 76 is branched at the first circulation line 74 and is provided to be able to supply the IPA to the processing liquid supplier 40. The supply line 76 interconnects the first circulation line 74 and the processing liquid supplier 40 which supplies the wafer W with the IPA.

The supply line 76 is provided with a flowmeter 100, a constant pressure valve 101, a filter 102, and an opening/closing valve 103. Specifically, the supply line 76 is provided with the flowmeter 100, the constant pressure valve 101, the filter 102, and the opening/closing valve 103 in this order from the side of the first circulation line 74. That is, the supply line 76 is provided with the flowmeter 100, the constant pressure valve 101, the filter 102, and the opening/closing valve 103 in this order from the upstream side in the flow direction of IPA flowing from the first circulation line 74 to the processing liquid supplier 40.

The flow meter 100 measures the flow rate of the IPA flowing through the supply line 76. The constant pressure valve 101 adjusts the pressure of the IPA at the downstream side of the constant pressure valve 101. For example, the constant pressure valve 101 adjusts the pressure of the IPA such that an ejection amount of the IPA ejected from the nozzle of the processing liquid supplier 40 becomes a given ejection amount. That is, the constant pressure valve 101 adjusts the flow rate of the IPA ejected from the nozzle of the processing liquid supplier 40. The given ejection amount is a preset amount and is set according to conditions for processing the wafer W. The constant pressure valve 101 adjusts the pressure of the IPA based on a signal from the control device 4.

The filter 102 is provided in the supply line 76 at the upstream side of the location where the return line 77 and the supply line 76 are joined. The filter 102 is provided in the supply line 76 at the downstream side of the constant pressure valve 101. The filter 102 removes foreign substances in the IPA flowing through the supply line 76.

The filter 102 is a smaller filter than the filter 83 provided in the first circulation line 74. The filter 102 is, for example, a POU filter. By using a small filter such as a POU filter, an increase in size of the supply line 76, that is, an increase in size of the substrate processing system 1, is suppressed.

The opening/closing valve 103 switches the supply and cutoff of the IPA to the processing liquid supplier 40. The IPA is supplied to the processing liquid supplier 40 by opening the opening/closing valve 103. That is, the IPA is ejected from the nozzle of the processing liquid supplier 40 by opening the opening/closing valve 103. The IPA is not supplied to the processing liquid supplier 40 by closing the opening/closing valve 103. That is, by closing the opening/closing valve 103, the IPA is not ejected from the nozzle of the processing liquid supplier 40. The opening/closing valve 103 is opened/closed based on a signal from the control device 4.

The return line 77 is connected to the supply line 76 and causes the IPA to return from the supply line 76 to the tank 71. The return line 77 is connected to the supply line 76 at a junction location provided between the filter 102 and the opening/closing valve 103. A plurality of return lines 77 are provided to correspond to the plurality of processing liquid suppliers 40, respectively. An opening/closing valve 110 is provided in the return line 77.

The opening/closing valve 110 switches the flow and cutoff of the IPA through the return line 77. The IPA flows from the supply line 76 to the return line 77 by opening the opening/closing valve 110. The IPA flowing in the return line 77 is returned to the tank 71. The IPA does not flow to the return line 77 by closing the opening/closing valve 110. The opening/closing valve 110 is opened/closed based on a signal from the control device 4.

Each of the opening/closing valves 103 and 110 switches the flow of the IPA to the return line 77, or the supply line 76 closer to the processing liquid supplier 40 than the junction location of the return line 77. In a supply state in which the IPA is supplied from the processing liquid supplier 40 to the wafer W, the opening/closing valve 110 provided in the return line 77 is closed and the opening/closing valve 103 provided in the supply line 76 is opened. In addition, in a standby state in which the IPA is not supplied from the processing liquid supplier 40 to the wafer W, the opening/closing valve 110 is opened, and the opening/closing valve 103 is closed.

A plurality of return lines 77 are joined at the downstream side of the opening/closing valve 110 in the flow direction of the IPA flowing through the return line 77 and connected to the tank 71. A temperature sensor 111 is provided in the return line 77 at the downstream side of the location where the plurality of return lines 77 are joined. The temperature sensor 111 detects the temperature of the IPA returning to the tank 71 from the return line 77. In addition, the return line 77 may be connected to the first circulation line 74 at the downstream side of the backing pressure valve 87.

<Flow Rate Control>

Next, a flow rate control process will be described with reference to FIG. 4. FIG. 4 is a flowchart for explaining the flow rate control process in the second circulation line 75 according to an embodiment.

The control device 4 determines whether or not the substrate processing system 1 is in an initial operation (S100). Specifically, the control device 4 determines whether or not the substrate processing system 1 is in the initial operation or in a normal operation. The initial operation includes an operation of replacing the IPA in the tank 71, an operation of replenishing the tank 71 with the IPA, and an operation of starting the substrate processing system 1. The normal operation includes operations other than the initial operation. During the initial operation, the opening/closing valve 110 is opened, and the opening/closing valve 103 is closed, as in the standby state.

When the substrate processing system 1 is in the normal operation ("No" in S100), the control device 4 detects the primary pressure of the filter 83 provided in the first circulation line 74 by the first pressure sensor 82 (S101). The control device 4 detects the primary pressure of the filter 93 provided in the second circulation line 75 with the first pressure sensor 92 (S102).

The control device 4 controls the pressure of the IPA applied to the filter 93 based on the detected pressure (S103). Specifically, the control device 4 controls the constant pressure valve 91 (an example of the adjuster) such that the pressure of the IAP applied to the filter 93 (an example of the second filter) becomes lower than the pressure of the IPA (an example of the processing liquid) applied to the filter 83 (an example of the first filter).

The amount of filtration in the filter 93 is controlled by controlling the constant pressure valve 91. Specifically, the control device 4 controls the constant pressure valve 91 so that the amount of filtration per unit time becomes a given first amount of filtration. The given first amount of filtration is a preset amount of filtration that is smaller than the amount of filtration per unit time in the filter 83.

When the substrate processing system 1 is in the initial operation ("Yes" in S100), the control device 4 increases the flow rate of the IPA flowing through the first circulation line 74 to be more than that during the normal operation (S104).

Specifically, the control device 4 controls at least one of the backing pressure valve 87 and the pump 80 to increase the flow rate of the circulating IPA to be more than that during the normal operation.

The control device 4 detects the primary pressure of the filter 83 provided in the first circulation line 74 with the first pressure sensor 82 (S105), and detects the primary pressure of the filter 93 provided in the second circulation line 75 with the first pressure sensor 92 (S106).

The control device 4 controls the pressure of the IPA applied to the filter 93 based on the detected pressure (S107). Specifically, the control device 4 controls the constant pressure valve 91 (an example of the adjuster) such that the pressure of the IAP applied to the filter 93 (an example of the second filter) becomes lower than the pressure of the IPA (an example of the processing liquid) applied to the filter 83 (an example of the first filter). During the initial operation, the control device 4 increases the flow rate of the IPA (an example of the processing liquid) flowing into the second circulation line 75 by the constant pressure valve 91 (an example of the adjuster) to be more than that during the normal operation.

The amount of filtration in the filter 93 is controlled by controlling the constant pressure valve 91. Specifically, the control device 4 controls the constant pressure valve 91 such that the amount of filtration per unit time becomes a given second amount of filtration. The given second amount of filtration is a preset amount of filtration that is more than the given first amount of filtration and less than the amount of filtration per unit time in the filter 83.

<Abnormality Detection Control>

Figure 5:
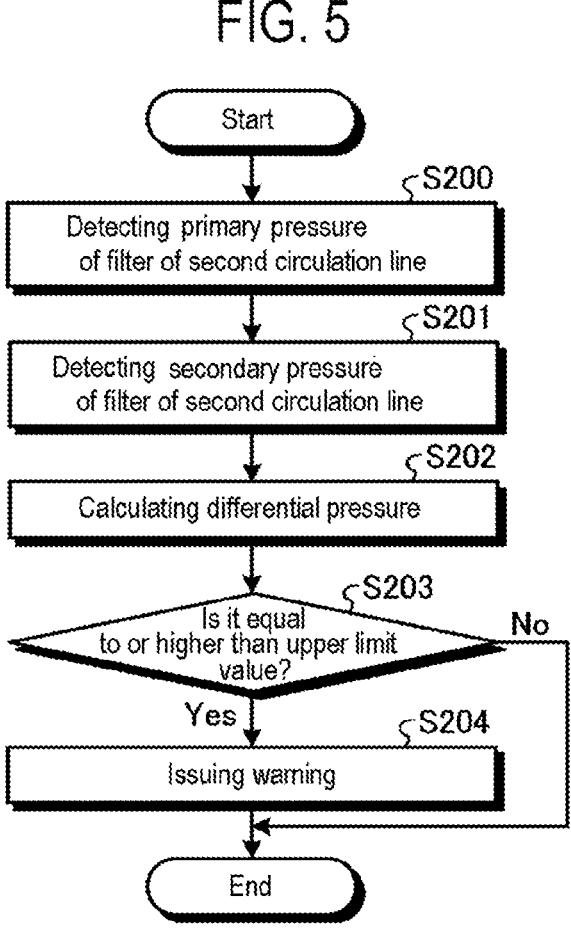
FIG. 5 is a flowchart for explaining abnormality detection control according to an embodiment.

Next, abnormality detection control will be described with reference to FIG. 5. FIG. 5 is a flowchart for explaining abnormality detection control according to an embodiment.

The control device 4 detects the primary pressure of the filter 93 provided in the second circulation line 75 with the first pressure sensor 92 (S200), and detects the secondary pressure of the filter 93 provided in the second circulation line 75 with the second pressure sensor 94 (S201).

Based on the detected pressures, the control device 4 calculates a differential pressure between the primary pressure and the secondary pressure of the filter 93 (S202), and determines whether or not the differential pressure is equal to or higher than a given upper limit value (S203). The given upper limit value is a value set in advance, and is a value at which an abnormality such as clogging may be determined to have occurred in the filter 93.

When the differential pressure is equal to or higher than the given upper limit value ("Yes" in S203), the control device 4 warns that an abnormality have occurred in the filter 93 (S204). The control device 4 notifies and warns an operator of the occurrence of the abnormality, for example, by turning on a warning lamp or displaying the occurrence of the abnormality on a monitor.

When the differential pressure is lower than the given upper limit value ("No" in S203), the control device 4 terminates this process.

The control device 4 may detect an abnormality in the filter 83 provided in the first circulation line 74 and may warn of the occurrence of the abnormality in the filter 83 in a similar control manner. In addition, the substrate processing system 1 may be provided with pressure sensors on the primary side and the secondary side of the filter 102 provided in the supply line 76, and may detect the occurrence of the abnormality in the filter 102 and issue a warning in a similar control manner.

Effects

The substrate processing system 1 (the liquid processing apparatus) includes the tank 71 (an example of the storage tank), the first circulation line 74, and the second circulation line 75. The tank 71 stores the IPA (an example of the processing liquid). The first circulation line 74 causes the IPA sent from the tank 71 to pass through the filter 83 (an example of the first filter) and to returns to the tank 71. The second circulation line 75 is connected to the first circulation line 74 and causes the IPA to pass through the filter 93 (an example of the second filter) and to return to the tank 71. The second circulation line 75 has a flow path length shorter than that of the first circulation line 74. The flow rate of the IPA flowing into the second circulation line 75 is smaller than the flow rate of the IPA flowing into the first circulation line 74 at the downstream side of the junction location 74a where the first circulation line 74 and the second circulation line 75 are joined. The amount of filtration per unit time in the filter 93 is smaller than the amount of filtration per unit time in the filter 83.

With this configuration, the substrate processing system 1 may reduce the flow rate of the IPA flowing through the second circulation line 75 and improve the ability of the filter 93 to collect foreign substances. Therefore, the substrate processing system 1 may improve the cleanliness of the IPA. In addition, the substrate processing system 1 may remove foreign substances in the IPA using the small filter 93 and to suppress an increase in size of the system. In addition, the substrate processing system 1 may shorten the length of the flow path of the second circulation line 75 and shorten the passage time of the IPA in the second circulation line 75. Therefore, the substrate processing system 1 may quickly remove foreign substances in the IPA.

The substrate processing system 1 includes the constant pressure valve 91 (an example of the adjuster) and the control device 4. The constant pressure valve 91 is provided in the second circulation line 75 and adjusts the flow rate of the IPA (an example of the processing liquid) flowing into the filter 93 (an example of the second filter). The control device 4 controls the constant pressure valve 91. The control device 4 controls the constant pressure valve 91 such that the pressure of the IPA applied to the filter 93 is lower than the pressure of the IPA applied to the filter 83 (an example of the first filter).

With this configuration, the substrate processing system 1 may adjust the pressure applied to the filter 93, improve the ability of the filter 93 to collect foreign substances in the IPA, and improve the cleanliness of the IPA.

During the initial operation, the control device 4 increases the flow rate of the IPA (an example of the processing liquid) flowing into the second circulation line 75 by the constant pressure valve 91 (an example of the adjuster) to be more than that during the normal operation.

With this configuration, the substrate processing system 1 may quickly remove foreign substances in the IPA during the initial operation. Therefore, the substrate processing system 1 may shorten the initial operation time and to start the processing of the wafer W early.

When the differential pressure between the pressure of the IPA (an example of the processing liquid) at the upstream side of the filter 93 (an example of the second filter) and the pressure of the IPA at the downstream side of the filter 93 is equal to or higher than a given upper limit value, the control device 4 issues a warning.

With this configuration, the substrate processing system 1 may detect an abnormality such as clogging of the filter 93 and notify the operator or the like of such an abnormality. Therefore, the substrate processing system 1 may prevent the filter 93 from continuing in an abnormal state, and prevent substrate processing from being performed, for example, in a state in which the cleanliness of the IPA is degraded.

<Modifications>

The control device 4 may control the constant pressure valve 91 based on the pressure difference of the IPA between the primary side and the secondary side of the filter 83 provided in the first circulation line 74. For example, the control device 4 controls the constant pressure valve 91 such that the flow rate of the IPA flowing into the second circulation line 75 increases as the differential pressure increases.

With this configuration, the substrate processing system 1 may adjust the flow rate of the IPA flowing into the second circulation line 75 according to a status of the IPA flowing through the first circulation line 74.

Figure 6:
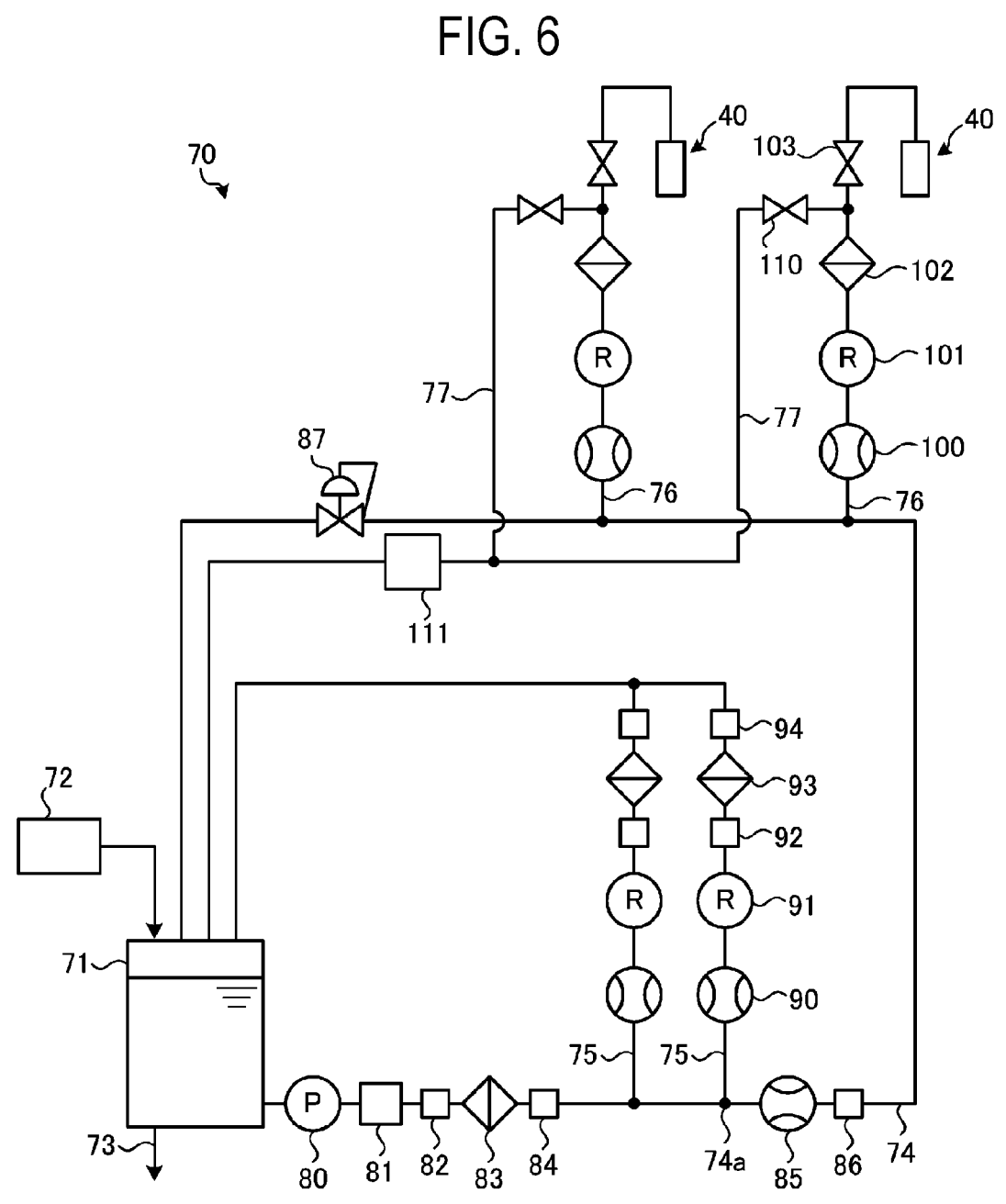

The substrate processing system 1 may be provided with a plurality of second circulation lines 75 as illustrated in FIG. 6. FIG. 6 is a view illustrating a schematic configuration of the processing liquid source 70 of the substrate processing system 1 according to the modification of the embodiment. The plurality of second circulation lines 75 are arranged in parallel. The plurality of second circulation lines 75 are joined at the downstream side of each second pressure sensor 94. Each of the plurality of second circulation lines 75 may be connected to the tank 71. FIG. 6 illustrates an example in which the processing liquid source 70 includes two second circulation lines 75, but the present disclosure is not limited thereto. The processing liquid source 70 may include three or more second circulation lines 75.

With this configuration, the substrate processing system 1 may remove foreign substances contained in the IPA by the filters 93 provided in the plurality of second circulation lines 75, and improve the cleanliness of the IPA. In addition, the substrate processing system 1 may quickly remove foreign substances in the IPA and initiate processing of the wafer W early during the initial operation.

In addition, the substrate processing system 1 may apply different pressures to the filters 93 provided in the plurality of second circulation lines 75. The substrate processing system 1 controls the pressure applied to each filter 93 by controlling respective constant pressure valves 91 provided in the plurality of second circulation lines 75.

With this configuration, the substrate processing system 1 may adjust the ability to collect foreign substances in the IPA and adjust the flow rate of the IPA flowing into the first circulation line 74 at the downstream side of the location where the second circulation lines 75 and the first circulation line 74 are joined. Therefore, the substrate processing system 1 may stabilize the IPA supplied from the processing liquid supplier 40 to the wafer W while adjusting the ability to collect foreign substances in the IPA during the supply of the IPA.

Figure 7:
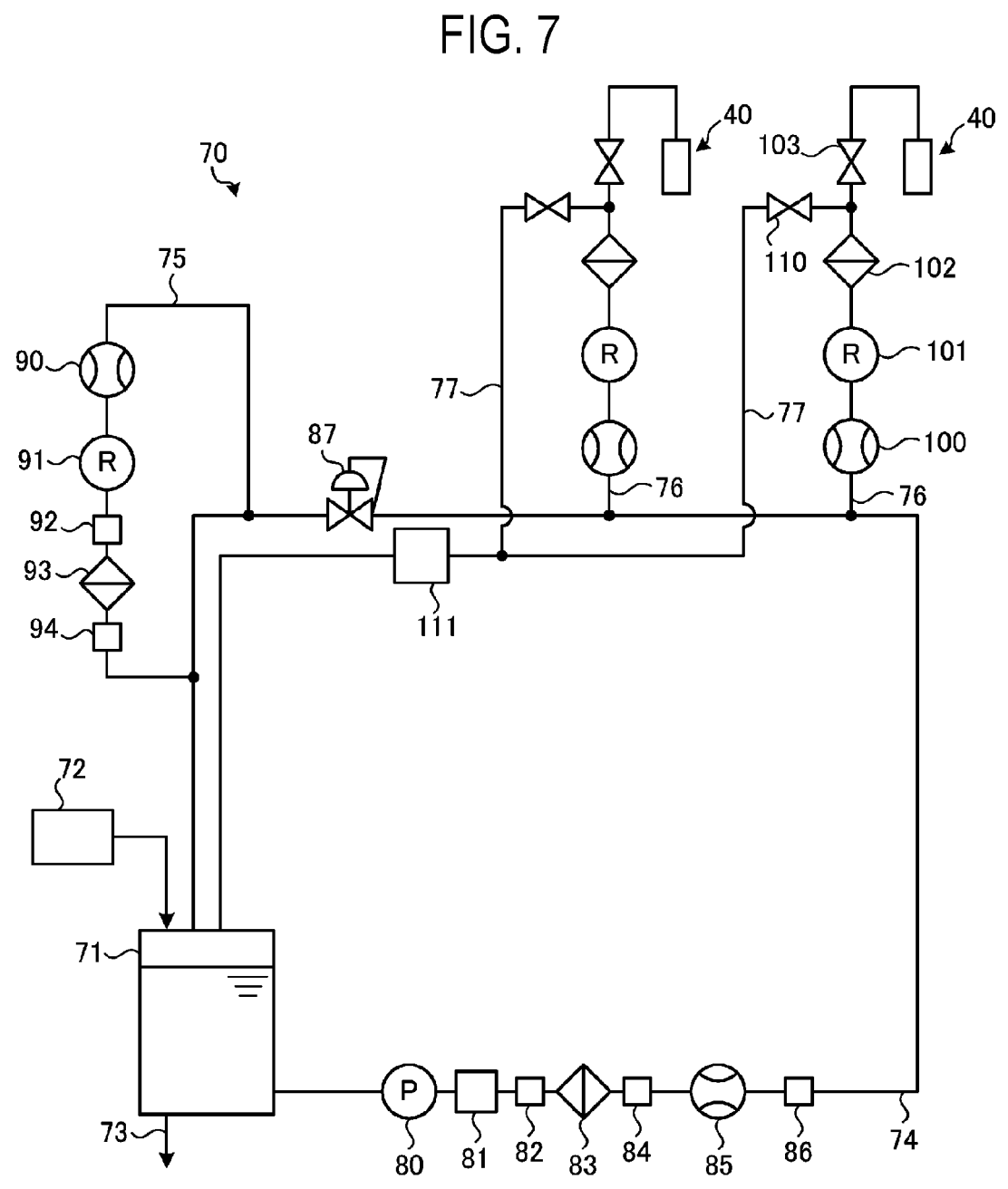

In addition, the second circulation lines 75 may be connected to the first circulation line 74 at the downstream side of the backing pressure valve 87, as illustrated in FIG. 7. FIG. 7 is a view illustrating a schematic configuration of a processing liquid source 70 of the substrate processing system 1 according to a modification of the embodiment.

With this configuration, the substrate processing system 1 may suppress a change in the flow rate of the IPA flowing into the supply line 76 when the constant pressure valve 91 provided in the second circulation line 75 is controlled. Therefore, the substrate processing system 1 may improve the cleanliness of the IPA and stabilize the IPA ejected from the processing liquid supplier 40 during the supply of the IPA.

Figure 8:
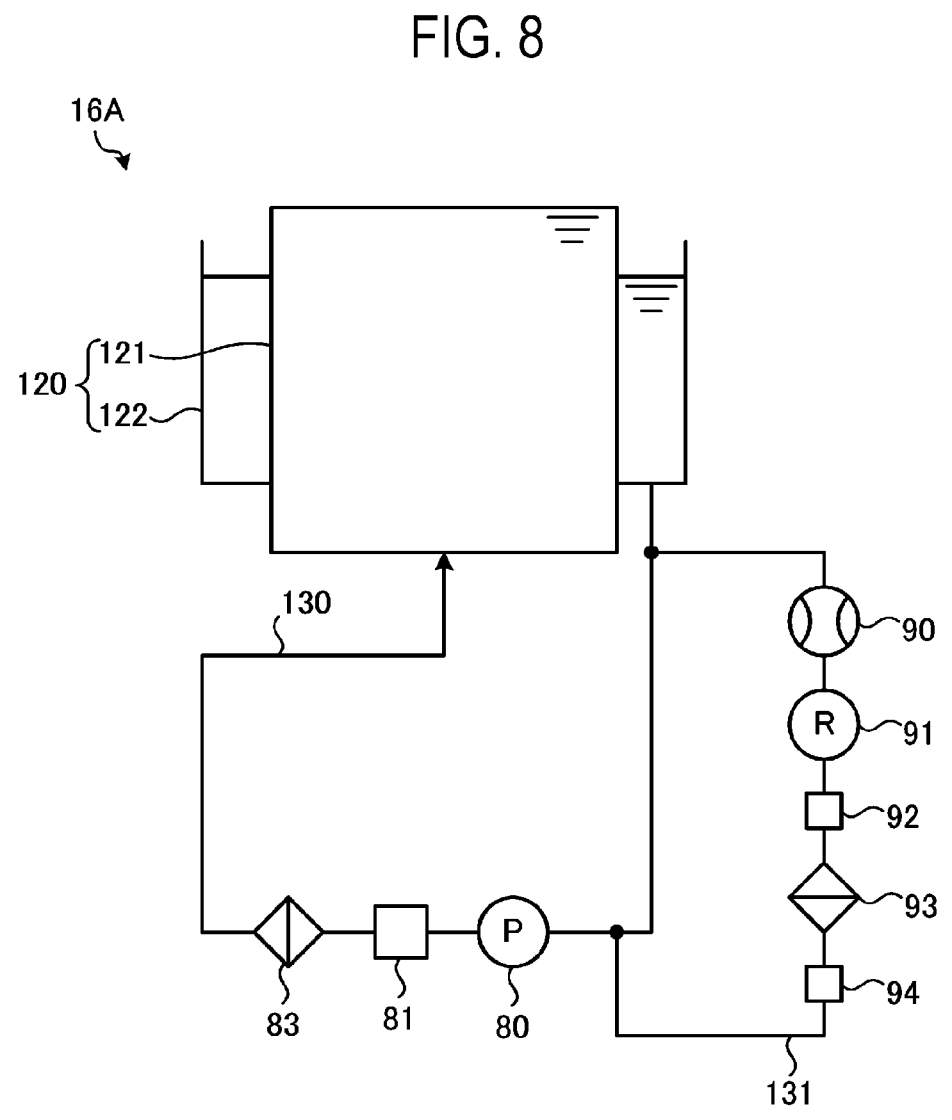

In addition, as illustrated in FIG. 8, a processing unit 16A of the substrate processing system 1 may include an inner bath 121 and an outer bath 122 as a processing bath 120 (an example of the storage tank). The substrate processing system 1 may be a system that performs substrate processing by immersing a plurality of wafers W in the processing liquid in the inner bath 121. FIG. 8 is a view illustrating a schematic configuration of a portion of the substrate processing system 1 according to the modification of the embodiment.

For example, a phosphoric acid aqueous solution and DIW are supplied to the processing bath 120, and a processing liquid having a given phosphoric acid concentration is generated as an etchant. The generated processing liquid circulates through the processing bath 120 via a first circulation line 130. The first circulation line 130 is provided with the pump 80, the filter 83, and the like.

The etchant overflowing from the inner bath 121 flows into the outer bath 122. The outer bath 122 and the inner bath 121 are connected to each other via the first circulation line 130. The etchant in the outer bath 122 is supplied to the inner bath 121 through the first circulation line 130. That is, the etchant circulates through the outer bath 122 and the inner bath 121 via the first circulation line 130.

A second circulation line 131 is connected to the first circulation line 130. For example, the second circulation line 131 is connected to the first circulation line 130 at the upstream side of the pump 80 in the flow direction of the etchant in the first circulation line 130. The second circulation line 131 may be connected to the first circulation line 130 at the downstream side of the filter 83 in the flow direction of the etchant in the first circulation line 130. The second circulation line 131 has a flow path length shorter than that of the first circulation line 130. The second circulation line 131 is provided with the flowmeter 90, the filter 93, and the like.

With this configuration, the substrate processing system 1 may remove foreign substances in the etchant flowing through the first circulation line 130 with the filter 93 provided in the second circulation line 131. Therefore, the substrate processing system 1 may improve the cleanliness of the etchant.

It shall be understood that the embodiments disclosed herein are examples in all respects and are not restrictive. Indeed, the above-described embodiments can be implemented in various forms. The embodiments described above may be omitted, replaced, or modified in various forms without departing from the scope and spirit of the appended claims.

EXPLANATION OF REFERENCE NUMERALS

1: substrate processing system (liquid processing apparatus), 4: control device, 16: processing unit, 16A: processing unit 40: processing liquid supplier, 70: processing liquid source, 71: tank (storage tank), 74: first circulation line, 75: second circulation line, 80: pump, 82: first pressure sensor, 83: filter (first filter), 84: second pressure sensor, 91: constant pressure valve (adjuster), 92: first pressure sensor, 93: filter (second filter), 94: second pressure sensor, 130: first circulation line, 131: second circulation line

What is claimed is:

1. A liquid processing apparatus comprising:

a storage tank that stores a processing liquid;

a first circulation line configured to cause the processing liquid sent from the storage tank to pass through a first filter and to return to the storage tank; and at least one second circulation line connected to the first circulation line such that the processing liquid sent from the storage tank also passes through a second filter while passing through the first filter, and the processing liquid passing through the second filter directly returns to the storage tank, wherein the at least one second circulation line is shorter in a flow path than the first circulation line, a second flow rate of the processing liquid flowing into the at least one second circulation line is smaller than a first flow rate of the processing liquid flowing into the first circulation line at a downstream side of a junction location where the first circulation line and the at least one second circulation line are joined, and the second filter is smaller in a filtration amount per unit time than the first filter.

2. The liquid processing apparatus of claim 1, further comprising:

a control device configured to control an adjuster provided in the at least one second circulation line to adjust a flow rate of the processing liquid flowing into the second filter, wherein the control device is further configured to control the adjuster so that a first pressure of the processing liquid applied to the second filter is lower than a second pressure of the processing liquid applied to the first filter.

3. The liquid processing apparatus of claim 2, wherein the control device is further configured to increase the second flow rate of the processing liquid flowing into the at least one second circulation line with the adjuster during an initial operation rather than during a normal operation.

4. The liquid processing apparatus of claim 3, wherein the control device is further configured to issue a warning when a differential pressure between an upstream-side pressure of the processing liquid at an upstream side of the second filter and a downstream-side pressure of the processing liquid at the downstream side of the second filter is equal to or higher than a given upper limit value.

5. The liquid processing apparatus of claim 4, wherein the at least one second circulation lines includes a plurality of second circulation lines.

6. The liquid processing apparatus of claim 3, wherein the at least one second circulation lines includes a plurality of second circulation lines.

7. The liquid processing apparatus of claim 2, wherein the at least one second circulation lines includes a plurality of second circulation lines.

8. The liquid processing apparatus of claim 1, wherein the at least one second circulation lines includes a plurality of second circulation lines.

9. A liquid processing method comprising:

a first circulation operation of causing a processing liquid sent from a storage tank to pass through a first filter provided in a first circulation line and to return to the storage tank; and a second circulation operation of causing the processing liquid sent from the storage tank to also pass through a second filter provided in a second circulation line connected to the first circulation line while passing through the first filter, and causing the processing liquid passing through the second filter to directly return to the storage tank, wherein the second circulation line is shorter in a flow path than the first circulation line, the processing liquid flowing into the second circulation line is smaller in a flow rate than the processing liquid flowing into the first circulation line at a downstream side of a junction location where the first circulation line and the second circulation line are joined, and the second filter is smaller in a filtration amount per unit time than the first filter.

* * * * *